United States Patent
Hongo et al.

(10) Patent No.: US 8,092,642 B2
(45) Date of Patent: Jan. 10, 2012

(54) PLASMA PROCESSING APPARATUS

(75) Inventors: Toshiaki Hongo, Hyogo (JP); Masaki Hirayama, Miyagi (JP); Tadahiro Ohmi, Miyagi (JP)

(73) Assignees: Tokyo Electron Limited, Tokyo (JP); Tohoku University, Miyagi (JP)

( * ) Notice: Subject to any disclaimer, the term of this patent is extended or adjusted under 35 U.S.C. 154(b) by 393 days.

(21) Appl. No.: 12/392,133

(22) Filed: Feb. 25, 2009

(65) Prior Publication Data
US 2009/0214400 A1 Aug. 27, 2009

(30) Foreign Application Priority Data
Feb. 26, 2008 (JP) ................. 2008-045014

(51) Int. Cl.
C23C 16/00 (2006.01)
C23F 1/00 (2006.01)
H01L 21/306 (2006.01)

(52) U.S. Cl. ..... 156/345.41; 118/723 MW; 118/723 AN
(58) Field of Classification Search ............. 156/345.41; 118/723 MW, 723 AN
See application file for complete search history.

(56) References Cited

U.S. PATENT DOCUMENTS

| | | | |
|---|---|---|---|
| 6,388,632 B1 * | 5/2002 | Murakawa et al. | 343/770 |
| 6,779,481 B2 * | 8/2004 | Kent et al. | 118/723 R |
| 2002/0123200 A1 * | 9/2002 | Yamamoto et al. | 438/345 |
| 2004/0045672 A1 * | 3/2004 | Ishii et al. | 156/345.41 |

FOREIGN PATENT DOCUMENTS

| | | |
|---|---|---|
| JP | 08-186101 A | 7/1996 |
| JP | 2001-135499 A | 5/2001 |
| JP | 2001-203189 A | 7/2001 |
| JP | 2003-203869 A | 7/2003 |
| JP | 2005-268763 A | 9/2005 |

OTHER PUBLICATIONS

Machine Translation of JP 2001-135499, Tanaka dated May 18, 2001.*
Machine Translation of JP 2001-203189, Ino et al dated Jul. 27, 2001.*
Japanese Office action for 2008-045014 dated Feb. 9, 2010.

* cited by examiner

*Primary Examiner* — Rakesh Dhingra
(74) *Attorney, Agent, or Firm* — Pearne & Gordon LLP

(57) ABSTRACT

Provided is a plasma processing apparatus capable of generating a uniform plasma by preventing a nonuniformity of a current flow in a slot antenna. A dielectric plate is disposed to close a top opening of a plate cover and a slot antenna for generating plasma is disposed on the dielectric plate. By allowing an outer periphery of the slot antenna to make direct contact with an inner wall portion of the plate cover by using a conductive member having elasticity, when a microwave is supplied to slot antenna, it is possible to make an electrical resistance between the inner wall portion of the processing vessel and the outer periphery of the flat plate antenna substantially the same at any point in the entire circumference of the processing vessel, so that magnitude of the microwave current flowing in the slot antenna can be made approximately the same.

7 Claims, 6 Drawing Sheets

PLASMA PROCESSING APPARATUS

FIELD OF THE INVENTION

The present disclosure relates to a plasma processing apparatus for performing a plasma process on a target substrate to be processed.

BACKGROUND OF THE INVENTION

FIG. 7 is a cross sectional view for illustrating a conventional plasma processing apparatus 30 and FIG. 8 is a plane view for illustrating a slot antenna 5 shown in FIG. 7. The plasma processing apparatus 30 illustrated in FIG. 7 is disclosed in, for example, Japanese Patent Laid-Open Application No. 2005-268763.

In FIG. 7, the plasma processing apparatus 30 includes a processing vessel 1 having a top opening, and the processing vessel 1 is configured by stacking up a chamber 11, an upper plate 12, a spacer 13 and a plate cover 14. These are all made of aluminum alloy. In the processing vessel 1, there is disposed a susceptor 3 for holding a target substrate 2 to be processed. The susceptor 3 is supplied with a high frequency bias signal from an AC power supply 17 installed outside of the processing vessel 1.

In order to achieve a uniform exhaustion in the processing vessel 1, there is formed a ring-shaped space 1A around the susceptor 3. In a bottom portion of the processing vessel 1, there is installed a gas exhaust pipe 16 for exhausting a gas inside of the processing vessel 1 by means of a non-illustrated gas exhaust device such as a vacuum pump or the like. On top of the processing vessel 1, there is disposed a dielectric plate 4 at a position corresponding to the target substrate 2 on the susceptor 3, and also on top of the dielectric plate 4, there is installed a slot antenna 5.

The slot antenna 5 is a radial line slot antenna as illustrated in FIG. 8, and it includes a slot antenna radiation plate 5a of a flat disc shape connected with an outer waveguide of a coaxial waveguide 9. In an opening of the slot antenna radiation plate 5a, there are formed a plurality of slots 5b and a plurality of slots 5c perpendicular thereto, and also there is formed a plurality of installation holes 5d along an outer periphery of the slot antenna radiation plate 5a. On top of the slot antenna 5, there is disposed a wavelength shortening plate 6, and the slot antenna radiation plate 5a is fixed to a cooling plate 7 by firmly driving screws 15 into the installation holes 5d. The cooling plate 7 covers the wavelength shortening plate 6 and the slot antenna 5 to cool the slot antenna 5, and cooling water is supplied therein. The cooling plate 7 is fixed to the plate cover 14 by a cooling plate fixing device 10.

The slot antenna 5 is connected with a microwave output terminal of an external microwave generator 8 via the coaxial waveguide 9, and a ground terminal of the microwave generator 8 is connected with the processing vessel 1. The microwave generator 8 supplies a microwave of, e.g., 2.45 GHz to the slot antenna 5 via the coaxial waveguide 9 from a non-illustrated load matching box. A plasma gas, which is supplied from a non-illustrated gas supply port and discharged to a space 1B, is excited by the microwave from the microwave generator 8.

When performing a plasma process in the plasma processing apparatus 30 configured as stated above, the target substrate 2 is mounted on the susceptor 3 in the processing vessel 1, and the inside of the processing space 1B is kept at a predetermined pressure by supplying a predetermined processing gas to the inside of the processing vessel 1 from a gas inlet while performing an exhaustion through the gas exhaust pipe 16. Further, a high frequency bias is applied to the target substrate 2 by the AC power supply 17, and a microwave generated from the microwave generator 8 is supplied to the slot antenna 5.

The microwave spreads and proceeds between the slot antenna 5 and the cooling plate 7 in a radial direction, while a wavelength thereof is shortened by the wavelength shortening plate 6. By concentrically arranging the slots 5b and 5c and arranging them perpendicular to each other so as to correspond to the wavelength of the microwave proceeding in a radial direction, it is possible to radiate a plane wave having a circular polarized wave to the slot antenna 5 in a substantially vertical direction, so that an electric field is generated at a lower portion of the dielectric plate 4. In this manner, the processing gas inside of the space 1B is converted into plasma, and, a predetermined plasma process is performed on the target substrate 2 by selecting kinds of the processing gases. Patent Document 1: Japanese Patent Laid-Open Application No. 2005-268763

BRIEF SUMMARY OF THE INVENTION

FIGS. 9 and 10 are cross sectional views of principal parts for explaining a path through which a microwave current flows from the slot antenna 5 to the processing vessel 1 in the plasma processing apparatus 30 illustrated in FIG. 7. In particular, FIG. 9 provides an enlarged view of a part encircled by a dashed dotted line 30A of FIG. 7 and likewise, FIG. 10 provides enlarged views of parts encircled by dashed dotted lines 30A and 30B.

The cooling plate 7 and the plate cover 14 illustrated in FIG. 7 are formed as separate members so as to easily perform the maintenance thereof. The slot antenna 5 is fixed to the cooling plate 7 together with the wavelength shortening plate 6 by the screws 15, and when the cooling plate 7 is mounted on an opening of the plate cover 14, a slight gap is formed between the cooling plate 7 and the plate cover 14.

When mounting the cooling plate 7 on the plate cover 14, if the gap between the cooling plate 7 and the plate cover 14 becomes uniform, the cooling plate 7 does not make direct contact with the plate cover 14. Consequently, a current flows due to a skin effect, as indicated by an arrow IA of FIG. 9, in an upward direction along an outer wall portion of the cooling plate 7, and returns to the ground terminal of the microwave generator 8 by flowing along from a bottom surface of the cooling plate fixing device 10 to each inner wall portion of the plate cover 14, the spacer 13, the upper plate 12 and the chamber 11. In this case, a flow of the microwave current spreads and proceeds concentrically in a radial direction, so that it becomes uniform at a surface of the slot antenna 5 and a plasma density becomes uniform as well.

However, when manufacturing the cooling plate 7 or the plate cover 14, it is necessary to obtain a space due to a manufacturing accuracy or tolerance. Therefore, each time the cooling plate 7 is mounted on the plate cover 14, the cooling plate 7 is mounted on the plate cover 14 at a different position and thus a gap distance varies, and a gap dimension changes depending on each cooling plate 7 or plate cover 14. Further, the gap distance may also vary depending on an installation condition.

In particular, if the cooling plate 7 makes direct contact with the plate cover 14 at the dashed dotted line 30A side shown in FIG. 10, a gap at the dashed dotted line 30B side becomes wider. Therefore, at the dashed dotted line 30A side, a microwave current flows from the slot antenna 5 directly to a contact portion between the cooling plate 7 and the plate cover 14, as indicated by an arrow IB. On the contrary, at the dashed dotted line 30B side, in the same manner as explained with reference to FIG. 9, a microwave current flows along a path indicated by an arrow IC. Accordingly, a flow of microwave current in the slot antenna 5 is biased as shown by dashed lines in FIG. 8, so that it becomes nonuniform and a plasma density becomes nonuniform.

In view of the foregoing, there is provided a plasma processing apparatus capable of generating a uniform plasma by preventing a nonuniformity of a current flow caused by an installation condition or a dimensional error.

In accordance with the present disclosure, there is provided a plasma processing apparatus including: a processing vessel which has a top opening and is made of metal; a dielectric plate disposed to close the top opening of the processing vessel; a microwave supply source of which ground side is connected with the processing vessel, for supplying a microwave; a flat plate antenna which is disposed on the dielectric plate, for supplying the microwave from the microwave supply source to an inside of the processing vessel by transmitting it through the dielectric plate and generating plasma inside the processing vessel; and a conductive member which makes direct contact with an inner wall portion of the processing vessel and an outer periphery portion of the flat plate antenna.

By allowing the flat plate antenna to make direct contact with the inner wall portion of the processing vessel by using the conductive member, it is possible to make an electrical resistance between the inner wall portion of the processing vessel and the outer periphery of the flat plate antenna substantially the same at any point in the entire circumference of the processing vessel, so that magnitude of the microwave current thereof can be made approximately the same.

Desirably, the conductive member is installed at the flat plate antenna and elastically makes contact with the inner wall portion of the processing vessel over substantially an entire circumference of the processing vessel. Since the conductive member is installed at the flat plate antenna, it becomes easy to mount it on the processing vessel.

Desirably, the plasma processing apparatus further includes: a cover member covering the flat plate antenna, wherein the flat plate antenna is fixed to the cover member by a screw, and the conductive member is fixed to the cover member together with the flat plate antenna by the screw. Since the conductive member is fixed to the cover member together with the flat plate antenna, it becomes easy to install the conductive member.

Desirably, the conductive member has a ring shape and includes a contact piece which extends from an outer periphery portion of the conductive member toward an outer side in a diametrical direction and an upper side so as to elastically make contact with the inner wall portion of the processing vessel. Since the contact piece allows the conductive member to elastically make contact with the inner wall portion of the processing vessel, an electrical connection can be assured.

Desirably, the plasma processing apparatus further includes: a cover member covering the flat plate antenna, wherein the conductive member is held by the cover member and elastically makes contact with both the inner wall portion of the processing vessel and the flat plate antenna. Since the conductive member is supported by the cover member, it becomes easy to mount it on the processing vessel.

Desirably, the conductive member has a ring shape which is formed by winding a metal strip having a predetermined width in a spiral shape, the cover member includes a groove for fitting and inserting the conductive member thereinto, and the conductive member is fitted and inserted into the groove, thereby elastically making contact with the flat plate antenna and the inner wall portion of the processing vessel.

By fitting and inserting the conductive member into the groove, when the cover member is installed on the processing vessel, the conductive member is deformed under the pressure from the wall portion of the groove and the inner wall portion of the processing vessel, so that a good electrical connection between the flat plate antenna and the inner wall portion of the processing vessel can be obtained.

In accordance with the present disclosure, by allowing the flat plate antenna to make direct contact with the inner wall portion of the processing vessel by using the conductive member, it is possible to make an electrical resistance between the inner wall portion of the processing vessel and the outer periphery of the flat plate antenna substantially the same at any point in the entire circumference of the processing vessel, so that magnitude of the microwave current thereof can be approximately the same. Accordingly, the microwave is uniformly spread, so that uniform plasma can be generated.

BRIEF DESCRIPTION OF THE DRAWINGS

The disclosure may best be understood by reference to the following description taken in conjunction with the following figures.

EXPLANATION OF CODES

Figure 1:
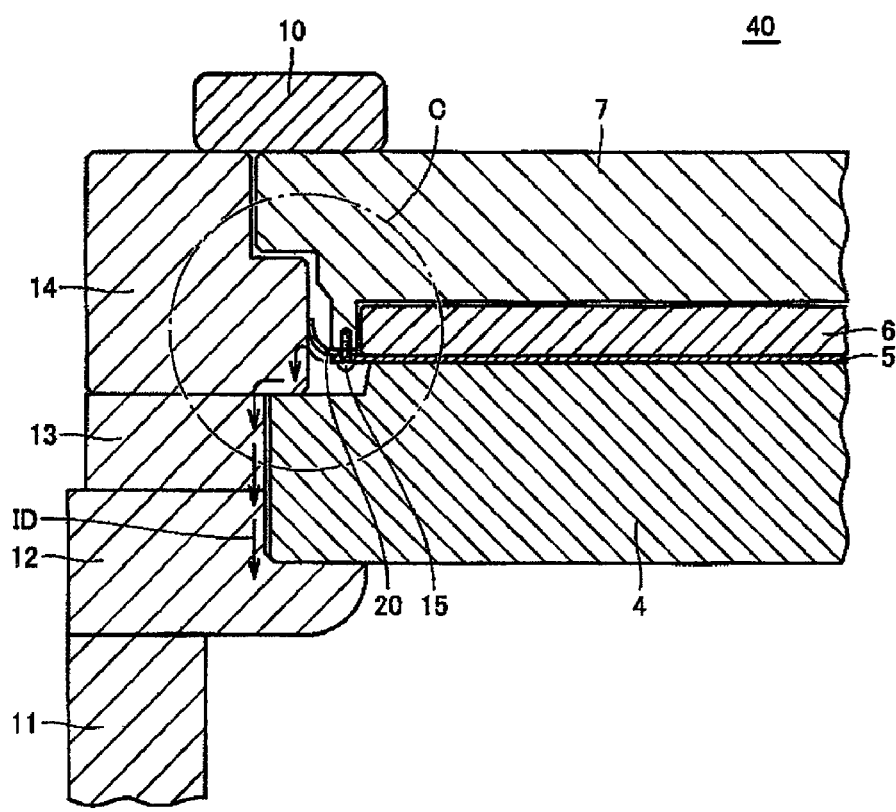
FIG. 1 is a cross sectional view of a principal part of a plasma processing apparatus 40 in accordance with an embodiment of the present disclosure and it is also an enlarged view of a part corresponding to a part indicated by a dashed dotted line 30A illustrated in FIG. 7.

4: Dielectric plate
5: Slot antenna
6: Wavelength shortening plate
7: Cooling plate
8: Microwave generator
9: Coaxial waveguide
10: Cooling plate fixing device
11: Chamber
12: Upper plate
13: Spacer
14: Plate cover
15: Screw 20, 25: Conductive member
21: Ring-shaped portion
22: Contact pieces
23: Holes
26: Wire
40, 50: Plasma processing apparatus
71: Groove

DETAILED DESCRIPTION OF THE INVENTION

Figure 2:
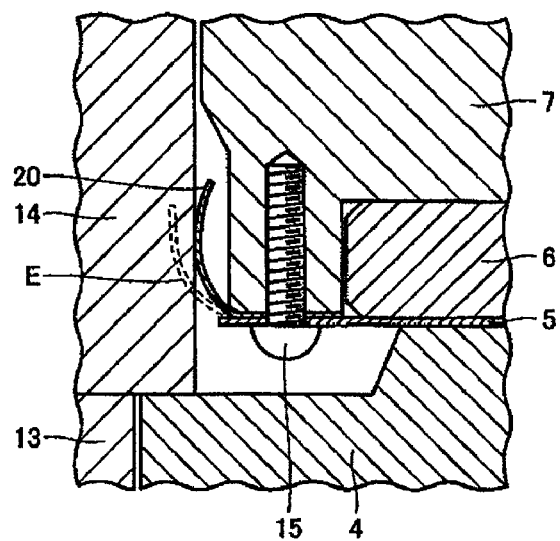
FIG. 2 is an enlarged view of a part indicated by a dashed dotted line C illustrated in FIG. 1.
Figure 7:
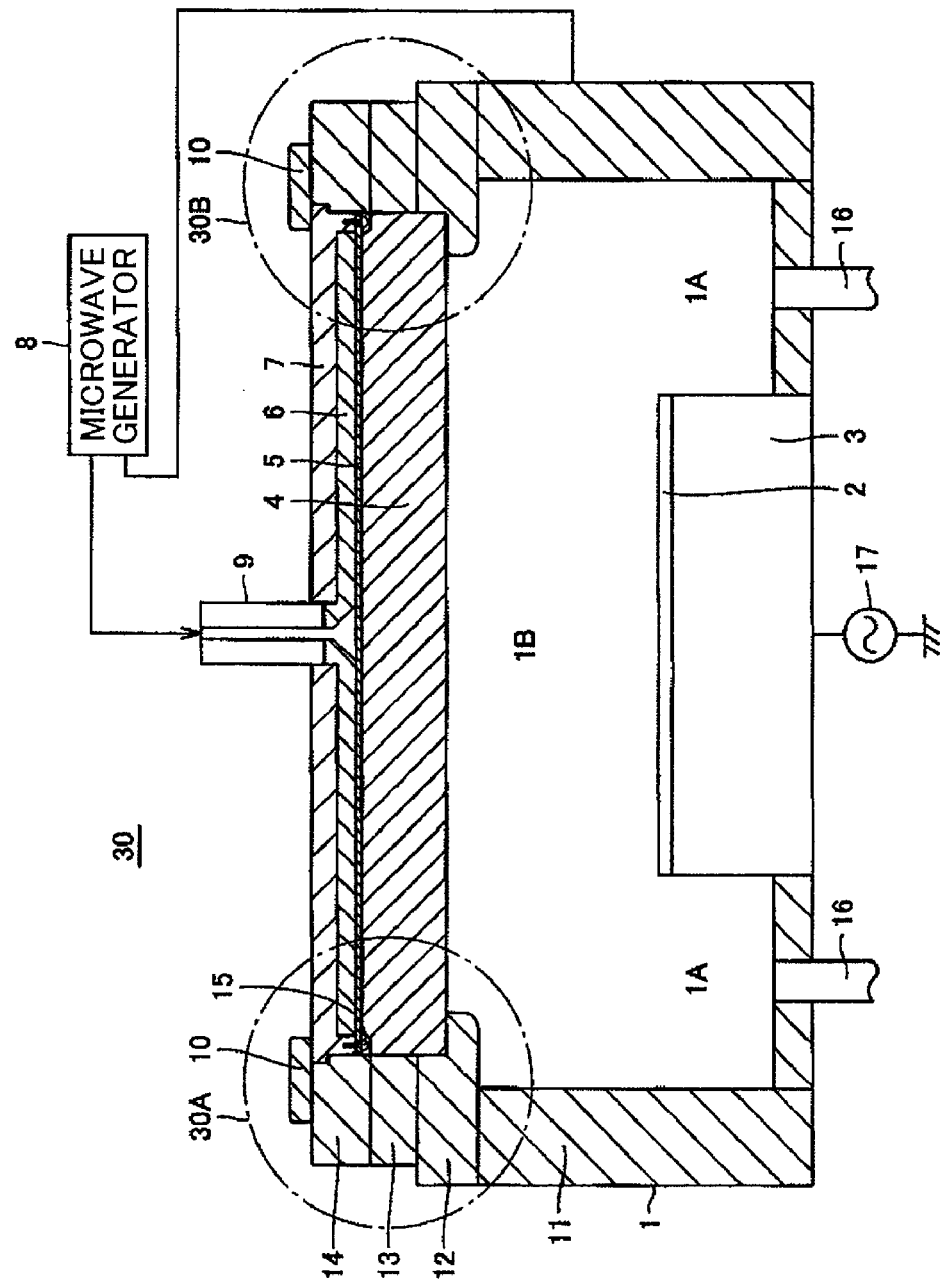
FIG. 7 is a cross sectional view of a conventional plasma processing apparatus 30.

FIG. 1 is a cross sectional view of a principal part of a plasma processing apparatus 40 in accordance with an embodiment of the present disclosure, and it also is an enlarged view of a part corresponding to the part indicated by the dashed dotted line 30A shown in FIG. 7; FIG. 2 is an enlarged view of a part indicated by a dashed dotted line C illustrated in FIG. 1; and FIG. 3 is a perspective view of external appearance of a conductive member 20 illustrated in FIGS. 1 and 2.

Figure 3:
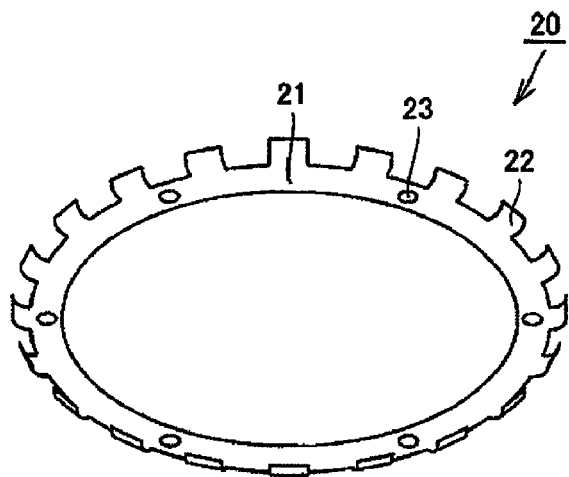
FIG. 3 is a perspective view of external appearance of a conductive member 20 shown in FIGS. 1 and 2.

In FIGS. 1 to 3, like the plasma processing apparatus 30 illustrated in FIG. 7, the plasma processing apparatus 40 in accordance with the embodiment of the present disclosure includes: a chamber 11 serving as the processing vessel 1, which has a top opening and is made of metal such as an aluminum alloy; an upper plate 12; a spacer 13; a plate cover 14; a dielectric plate 4 disposed to close the top opening of the processing vessel 1; a slot antenna 5 having a flat plate shape, which supplies a microwave to the dielectric plate 4 and then supplies the microwave to the inside of the processing vessel by transmitting it through the dielectric plate 4, so that plasma is generated in the processing vessel. Further, a wavelength shortening plate 6 is mounted on the slot antenna 5, and the slot antenna 5 is fixed to a cooling plate 7, which serves as a cover member, together with a conductive member 20 by a screw 15. The cooling plate 7 is fixed to the plate cover 14 by a cooling plate fixing device 10.

The conductive member 20 is installed at the slot antenna 5 and elastically makes direct contact with the inner side of the plate cover 14 over substantially an entire circumference of the plate cover 14 constituting a part of the processing vessel so as to form a path through which the microwave flows. By this path, over each entire circumference of the plate cover 14, the spacer 13, the upper plate 12 and the chamber 11, electrical resistances between respective inner wall portions thereof and an outer periphery of the slot antenna 5 at any point can be made approximately the same. Therefore, magnitude of the microwave current thereof can be made approximately the same, and thus the microwave can be uniformly propagated, so that uniform plasma can be generated. The conductive member 20 has a ring shape and is made of, e.g., phosphor bronze. As illustrated in FIG. 3, it includes a flat ring-shaped portion 21 which makes contact with a bottom surface of the cooling plate 7, and a plurality of contact pieces 22 extending from a peripheral portion of the ring-shaped portion 21 in diametric and upward directions. The contact pieces 22 elastically make contact with the inner wall portion of the processing vessel 1.

Figure 8:
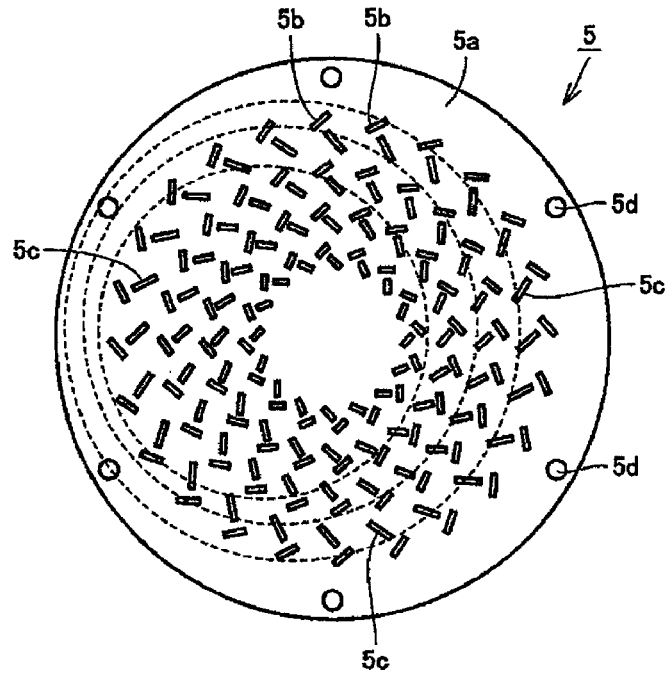
FIG. 8 is a plane view of a slot antenna 5 illustrated in FIG. 7.
Figure 9:
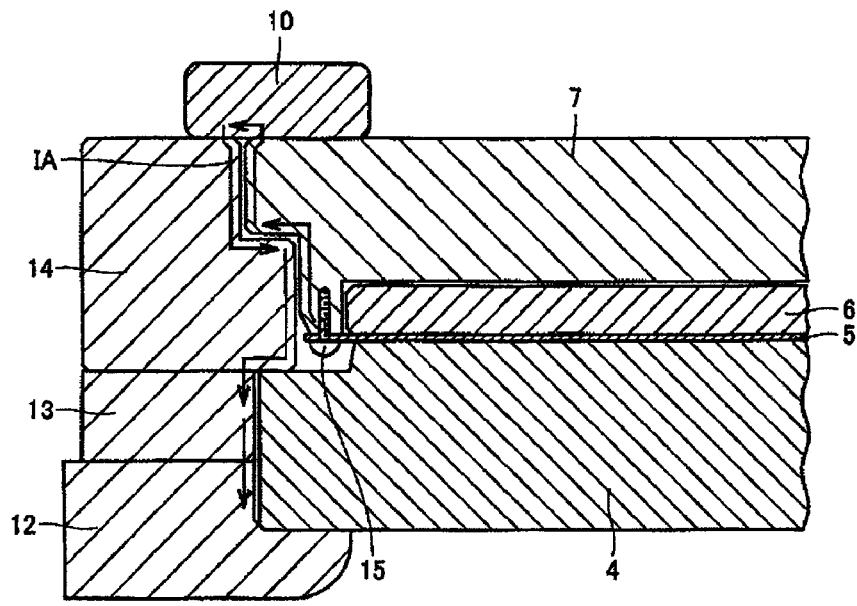
FIG. 9 is an enlarged view of a part encircled by a dashed dotted line 30A illustrated in FIG. 7.
Figure 10:
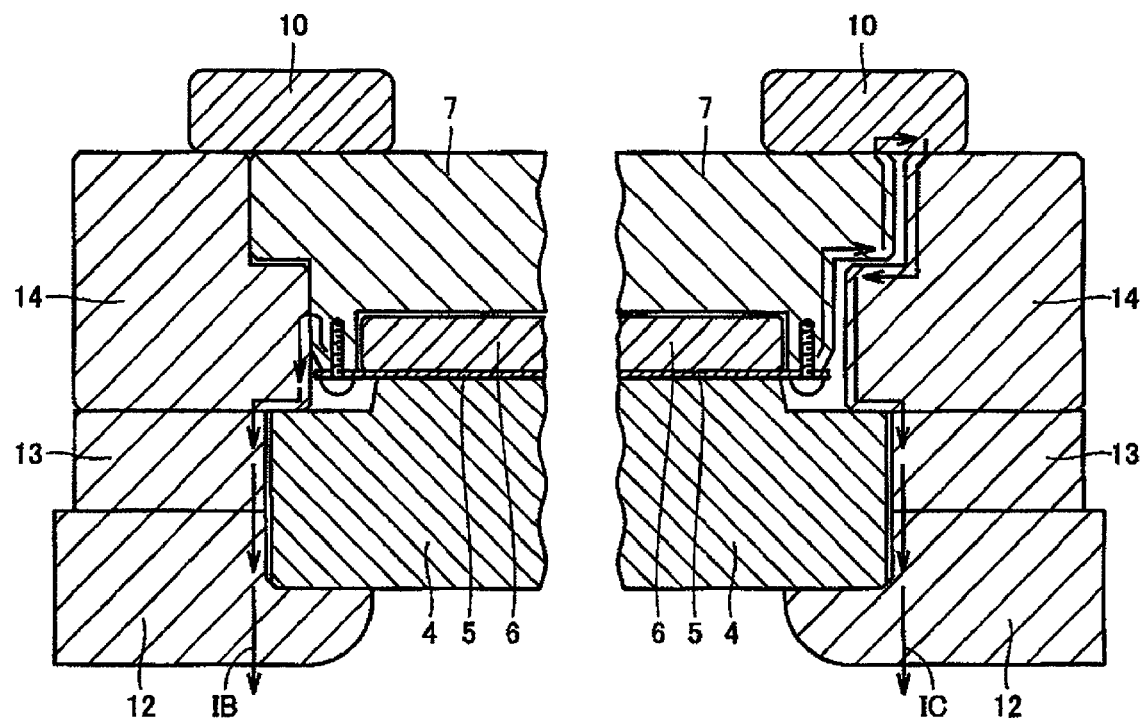
FIG. 10 is an enlarged view of a part encircled by a dashed dotted line 30B illustrated in FIG. 7.

In the ring-shaped portion 21, there are formed installation holes 23 corresponding to the installation holes 5d of the slot antenna 5 illustrated in FIG. 8. The conductive member 20 is screw-fixed to the cooling plate 7 by inserting the screw 15 into the installation holes 5d of the slot antenna 5 and the installation holes 23 of the conductive member 20. The contact pieces 22, as illustrated in FIG. 2, are formed to extend from the peripheral portion of the ring-shaped portion 21 outwardly in a diametrical direction and an upward direction, so that they have elasticity. For this reason, when the cooling plate 7, which is installed with the conductive member 20 and the slot antenna 5, is fixed to the plate cover 14, outer wall portions of the contact pieces 22 are compressed by the inner wall portion of the plate cover 14, so that it is deformed from a state indicated by a dashed line E into a state indicated by a solid line, thereby electrically connecting the slot antenna 5 with the plate cover 14 forcibly.

In FIG. 1, although not shown, there is installed a microwave generator serving as a microwave supply source in the same manner as in FIG. 7. A microwave is supplied to the slot antenna 5 from a microwave output terminal via a non-illustrated coaxial waveguide, and a ground terminal is connected with the processing vessel 1. If the microwave is supplied to the slot antenna 5 from the microwave generator, as indicated by an arrow ID in FIG. 1, the microwave current flows from the slot antenna 5 via the conductive member 20 to the plate cover 14, the spacer 13, the upper plate 12 and the chamber 11 and then returns to the microwave generator.

When installing the cooling plate 7, which is provided with the slot antenna 5, to the plate cover 14, there occurs a case in which the cooling plate 7 is mounted on the plate cover 14 at a position slightly deviated from a desired position. Accordingly, a gap distance may vary and a gap dimension for each cooling plate 7 or plate cover 14 may change. However, even in this case, it is possible to obtain an electrical connection between the inner wall portion of the plate cover 14 and the outer periphery of the slot antenna 5 by the conductive member 20. Therefore, it is possible to make an electrical resistance between the inner wall portion of the plate cover 14 and the outer periphery of the slot antenna 5 approximately the same, so that the microwave current flowing in the slot antenna 5 can be uniform. As a result, a density of the plasma generated from the entire surface of the slot antenna 5 can be formed uniform without being affected by a manufacturing accuracy or tolerance.

Figure 4:
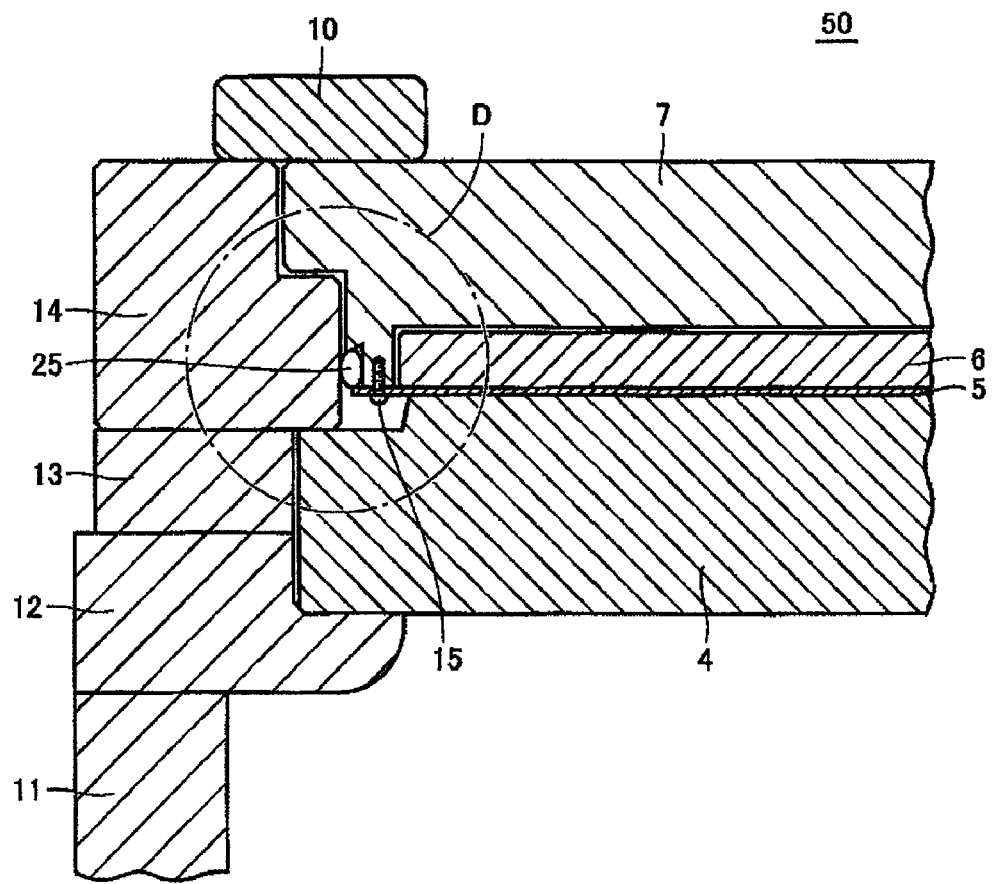
FIG. 4 is a cross sectional view of a principal part of a plasma processing apparatus 50 in accordance with another embodiment of the present disclosure and it is also an enlarged view of a part corresponding to a part indicated by a dashed dotted line 30A illustrated in FIG. 7.
Figure 5:
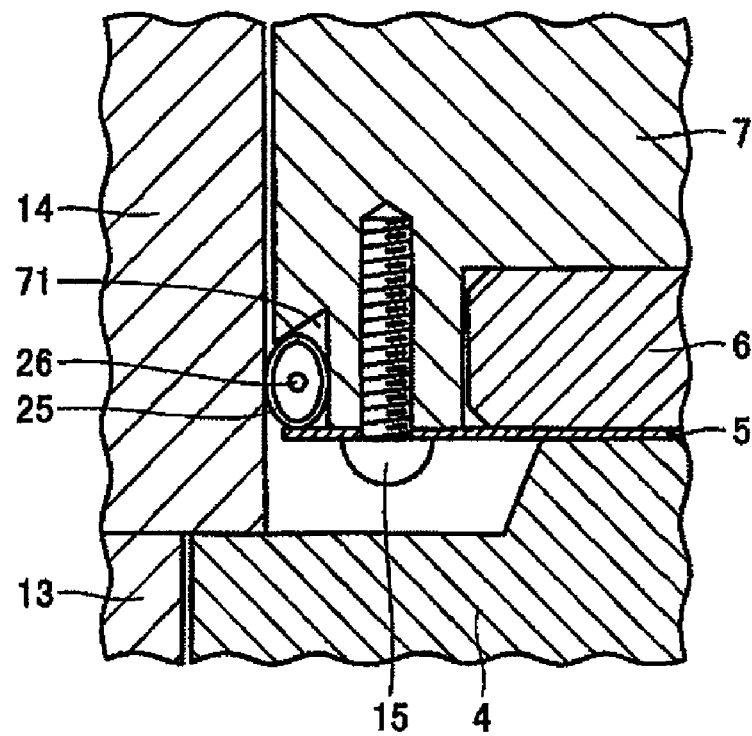
FIG. 5 is an enlarged view of a part indicated by a dashed dotted line D illustrated in FIG. 4.

FIG. 4 is a cross sectional view of a principal part of a plasma processing apparatus 50 in accordance with another embodiment of the present disclosure and it is also an enlarged view of a part corresponding to the part indicated by the dashed dotted line 30A illustrated in FIG. 7; FIG. 5 is an enlarged view of a part indicated by a dashed dotted line D illustrated in FIG. 4; and FIG. 6 is a perspective view of external appearance of a conductive member 25 illustrated in FIGS. 4 and 5.

The plasma processing apparatus of the present embodiment includes, in the same manner as FIG. 1, a chamber 11, an upper plate 12, a spacer 13, a plate cover 14, a dielectric plate 4, a slot antenna 5 and a wavelength shortening plate 6. The slot antenna 5 is fixed to a cooling plate 7 by a screw 15. The cooling plate 7 is fixed to the plate cover 14 by a cooling plate fixing device 10. The slot antenna 5 is electrically connected with an inner wall portion of the plate cover 14 via the conductive member 25.

Figure 6:
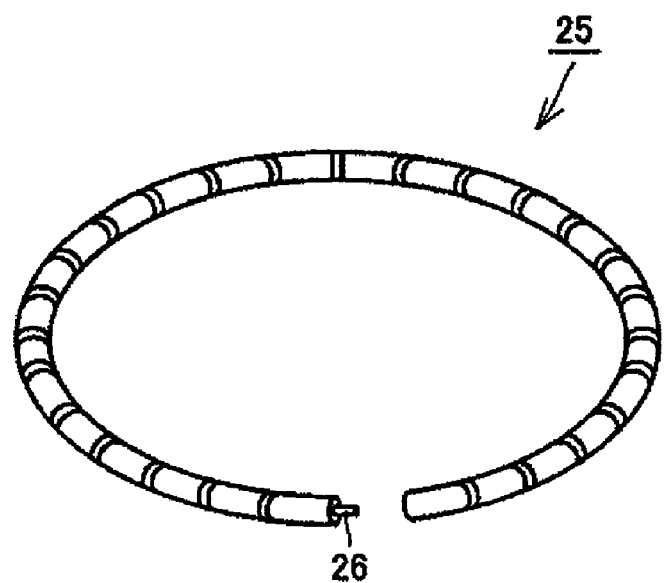
FIG. 6 is a perspective view of external appearance of a conductive member 25 shown in FIGS. 4 and 5.

The conductive member 25 used in the present embodiment has a predetermined width as illustrated in FIG. 6 and has a ring shape formed by winding a metal strip, which is made of copper, aluminum, SUS or the like having a thickness of, e.g., about 0.1 mm, in a spiral shape. Further, it is held by the cooling plate 7 and elastically makes contact with both the inner wall portion of the plate cover 14 and the slot antenna 5. In a lower portion of an outer wall portion of the cooling plate 7, a groove 71 of an inverse-V shape is formed over the entire area of the outer wall portion to face the inner wall portion of the plate cover 14. The conductive member 25 is fitted and inserted into the groove 71. At this time, as illustrated in FIG. 6, the conductive member 25 is formed into a circular shape by inserting a wire 26 thereinto, so that it is easily installed in the groove 71 and it is not separated during the installation thereof. After installing the conductive member 25 in the cooling plate 7, the cooling plate 7 is mounted on the plate cover 14.

Since the conductive member 25 is interposed between wall portions of the groove 71 and the inner wall portion of the plate cover 14, it is compressed, so that a cross section thereof is deformed into an elliptical shape from a circular shape. Consequently, the slot antenna 5 is pressed by the conductive member 25, so that the slot antenna 5 is electrically connected with the plate cover 14 and thus there is no potential difference therebetween, thereby maintaining them in an equipotential state. As a result, it is possible to obtain an electrical connection between the inner wall portion of the plate cover 14 and an outer periphery of the slot antenna 5, so that electrical resistances between the inner wall portion of the plate cover 14 and the outer periphery of the slot antenna 5 can be made approximately the same, thereby allowing a microwave current flowing in the slot antenna 5 to be uniform. Accordingly, a plasma density at the entire surface of the slot antenna 5 can be uniform without being affected by a manufacturing accuracy or tolerance.

Further, the conductive members 20 and 25 may be other than ones illustrated in FIGS. 3 and 6 as long as it can electrically connect the inner wall portion of the plate cover 14 with the outer periphery of the slot antenna 5.

The embodiments of the present invention have been explained with reference to the accompanying drawings but the present invention is not limited to the illustrated embodiments. It would be understood by those skilled in the art that various changes and modifications may be made without changing technical conception and essential features of the present invention.

The plasma processing apparatus of the present disclosure is applicable in performing a plasma process on a semiconductor substrate.

What is claimed is:

1. A plasma processing apparatus comprising:
   a processing vessel which has a top opening and is made of metal;
   a dielectric plate disposed to close the top opening of the processing vessel;
   a microwave supply source of which ground side is connected with the processing vessel, for supplying a microwave;
   a flat plate slot antenna which is installed on top of the dielectric plate, for supplying the microwave from the microwave supply source to an inside of the processing vessel by transmitting it through the dielectric plate and generating plasma inside the processing vessel; and
   a conductive member which makes direct contact between substantially an entire circumference of the inner wall of the processing vessel and an outer periphery of the flat plate slot antenna,
   wherein the microwave flows from the flat plate slot antenna to the inner wall portion of the processing vessel via the conductive member, so that the microwave flowing in the flat plate slot antenna is allowed to be uniform.

2. The plasma processing apparatus of claim 1, wherein the conductive member is installed at the flat plate slot antenna and elastically makes contact with the inner wall portion of the processing vessel over substantially an entire circumference of the processing vessel.

3. The plasma processing apparatus of claim 2, wherein the conductive member has a ring shape and includes a contact piece which extends from an outer periphery portion of the conductive member toward an outer side in a diametrical direction and an upper side so as to elastically make contact with the inner wall portion of the processing vessel.

4. The plasma processing apparatus of claim 2, further comprising:
   a cover member covering the flat plate slot antenna,
   wherein the flat plate slot antenna is fixed to the cover member by a screw, and the conductive member is fixed to the cover member together with the flat plate slot antenna by the screw.

5. The plasma processing apparatus of claim 4, wherein the conductive member has a ring shape and includes a contact piece which extends from an outer periphery portion of the conductive member toward an outer side in a diametrical direction and an upper side so as to elastically make contact with the inner wall portion of the processing vessel.

6. The plasma processing apparatus of claim 1, further comprising:
   a cover member covering the flat plate slot antenna,
   wherein the conductive member is held by the cover member and elastically makes contact with both the inner wall portion of the processing vessel and the flat plate slot antenna.

7. The plasma processing apparatus of claim 6, wherein the conductive member has a ring shape which is formed by winding a metal strip having a predetermined width in a spiral shape,
   the cover member includes a groove for fitting and inserting the conductive member thereinto, and
   the conductive member is fitted and inserted into the groove, thereby elastically making contact with the flat plate slot antenna and the inner wall portion of the processing vessel.

* * * * *